United States Patent [19]

Mittelmann

[11] 4,017,701
[45] Apr. 12, 1977

[54] INDUCTION HEATING UNIT WITH COMBINED TANK CIRCUIT AND HEATING COIL

[75] Inventor: Eugene Mittelmann, Chicago, Ill.

[73] Assignee: Illinois Tool Works Inc., Chicago, Ill.

[22] Filed: Feb. 7, 1975

[21] Appl. No.: 548,039

Related U.S. Application Data

[60] Division of Ser. No. 364,221, May 25, 1973, abandoned, which is a continuation of Ser. No. 230,234, Feb. 29, 1972, abandoned.

[52] U.S. Cl. .................. 219/10.49; 219/10.53; 219/10.77; 219/10.79; 336/69; 336/82; 361/270
[51] Int. Cl.² .................. H05B 5/08; H01F 15/14
[58] Field of Search ......... 219/10.79, 10.53, 10.49, 219/10.75, 10.77; 336/69, 82; 317/157.62, 256; 323/76; 307/293, 100, 133

[56] References Cited

UNITED STATES PATENTS

| | | | |
|---|---|---|---|
| 2,343,453 | 3/1944 | Gillespie | 219/10.75 X |
| 2,515,874 | 7/1950 | Hoyler et al. | 219/10.79 X |
| 2,662,162 | 12/1953 | Blok | 219/10.75 |
| 2,785,265 | 3/1957 | Salisbury | 219/10.79 |
| 3,052,281 | 9/1962 | Hilton | 219/10.53 X |
| 3,210,703 | 10/1965 | Lockie | 336/69 X |
| 3,688,232 | 8/1972 | Szatmari | 336/69 |
| 3,704,390 | 11/1972 | Grahame | 336/69 X |

OTHER PUBLICATIONS

Markus, "Sourcebook of Electronic Circuits", p. 788, High-Current SCS Interval Timer, 1969.
Tudbury, "Basics of Induction Heating", 1960, Rider Publisher, vol. 2, pp. 63, 82.

Primary Examiner—Bruce A. Reynolds
Attorney, Agent, or Firm—Thomas W. Buckman; Robert W. Beart

[57] ABSTRACT

Disclosed is an induction heating apparatus wherein the tank circuit and heater coil are combined in a single unit which is separated from the power supply. A coil forms both the inductance element of a tuned circuit and the primary winding of a current transformer. The inductance element is associated with a secondary winding formed by a metal sheet of material wrapped about the inductance element and can form both the capacitance of the tuned circuit and the secondary winding of the current transformer. A heat transfer unit is connected directly to the secondary winding formed by the single turn of sheet material and is used to provide inductive heating to a work surface to which thermally activated adhesives are to be secured. The induction heating unit is formed as a hand-held portable gun and includes the electronic circuitry in a rear body portion of the gun and the heat transfer unit forms a nosepiece for the gun so that precise local areas can be heated.

8 Claims, 15 Drawing Figures

INDUCTION HEATING UNIT WITH COMBINED TANK CIRCUIT AND HEATING COIL

This is a division of application Ser. No. 364,221, filed 5/25/73, abandoned, which is a Continuation of Ser. No. 230,234 filed 2/29/72, now abandoned.

BACKGROUND OF THE INVENTION

This invention relates generally to induction heating apparatus, and more particularly to induction heating apparatus which allows the heater unit to be a hand-held portable device.

Induction heating is a relatively well known expedient for producing heat in localized areas on metal objects by the use of RF power which develops a varying electromagnetic field within the metal to be heated. The internal energy losses within the material cause it to heat up in a relatively short period of time.

However, one of the primary disadvantages of induction heating units heretofore utilized is that the RF power which is generated by the oscillator circuit has to be delivered over a transmission line to the induction heating element. By so transmitting the RF power, much of the energy generated within the system is lost and the general efficiency of the system is greatly reduced. This is not a significant disadvantage when utilizing induction heating units which have large receptacles wherein the components to be heated are placed or which have a chamber or container about which the heating elements are positioned. However, when small localized areas of large surfaces are to be heated the induction heating unit must take a different form and the problem of transmission line losses becomes significant.

One illustrated use of the induction heating apparatus of this invention is in connection with the automotive industry. Heretofore, automobiles have molding strips fastened by drilling holes through the side wall of the doors and fenders of the cars. To eliminate the drilling of holes, molding clips can be adhesively fastened to the surface of the automobile and the chrome or stainless steel decorative strip is then fastened to the glued on clip. By thus eliminating the holes through the sides of the automobiles, the amount of rust and corrosion which would otherwise occur within the interior of the car body is substantially reduced.

Because of the high rate of mass production of automobiles, it is necessary to have a clip which can be adhesively fastened to the side of an automobile quickly, within a matter of seconds, and which will not damage the already finished surface. This can be accomplished by utilizing thermosetting adhesive materials on the back side of the clip and heating the adhesive material, either directly or indirectly, to a temperature sufficiently high to cause it to thermally set. However, the temperature must not be so high as to damage the painted surface of the automobile or cause it to loosen from the parent metal. A securely bonded painted surface of an automobile can then receive a second bonded element which will form a strong connection between the second element and the base metal under the paint.

When utilizing thermosetting adhesive materials on molding clips as mentioned above it was found necessary to control the amount of heat, both its temperature and the time of application, within precise limits. For example, an improved form of thermosetting adhesive can be made plastic and become an adhesive at an elevated temperature of about 250° to 300° F. This must be done in a matter of about two to three seconds so that the elevated temperature will not damage the painted surface to which the adhesive is applied. Because of the short time duration of the applied heat, it is advantageous to use a heating apparatus which can be controlled either electrically or electronically to the precise limits necessary. Also, the heating unit must be small and easy to handle, and energy losses over the transmission lines between the power supply and the heating unit must be minimized so that the overall efficiency of the system is high and economically feasible.

SUMMARY OF THE INVENTION

The induction heating unit of this invention may include a cylindrical body portion having two ends with a handle housing means formed at one of the ends and a heating unit or nosepiece formed at the other end. The induction heating coils within the body portion are formed on cylinders of insulating material and one or more sheets or layers of metal material form a single turn secondary winding to which the nosepiece heating element is connected. The sheet or sheets thus forming the single turn for the current transformer may also form the capacitance element of the RF tuned circuit. In one form of the invention there are three such single sheets, one over the other, two of such sheets forming two plates of a capacitance element while the center sheet forms the other plate of the capacitance element. The inner and outermost sheets are connected together along one confronting edge segment while the opposite confronting edge segments are not connected together and only one of which is connected to the nosepiece heating element. This configuration increases the capacitance within the circuit for efficient operation.

Many objects, features and advantages of this invention will be more fully realized and understood from the following detailed description when taken in conjunction with the accompanying drawings wherein like reference numerals throughout the various views of the drawings are intended to designate similar elements or components.

DETAILED DESCRIPTION OF THE ILLUSTRATED EMBODIMENTS

Figure 1:
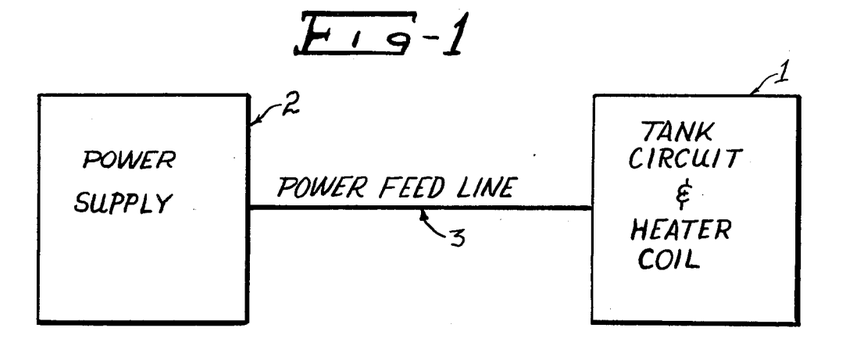
FIG. 1 is a simplified block diagram of an induction heating apparatus constructed in accordance with the principles of this invention.

Referring now to FIG. 1 there is seen a block diagram showing the basic concepts of the induction heating apparatus of this invention. Here a tank circuit and heater coil assembly 1 is energized by a power supply 2 over a power feed line 3. The tank circuit and heater coil are constructed so that they can be physically separated from the power supply and thereby are easily hand manipulated as a portable unit. Radiation losses are main-tained at a minimum by the physical separation of the power supply and the tank circuit because high levels of circulating current within the tank circuit are not transmitted over the power feed line 3.

Figure 2:
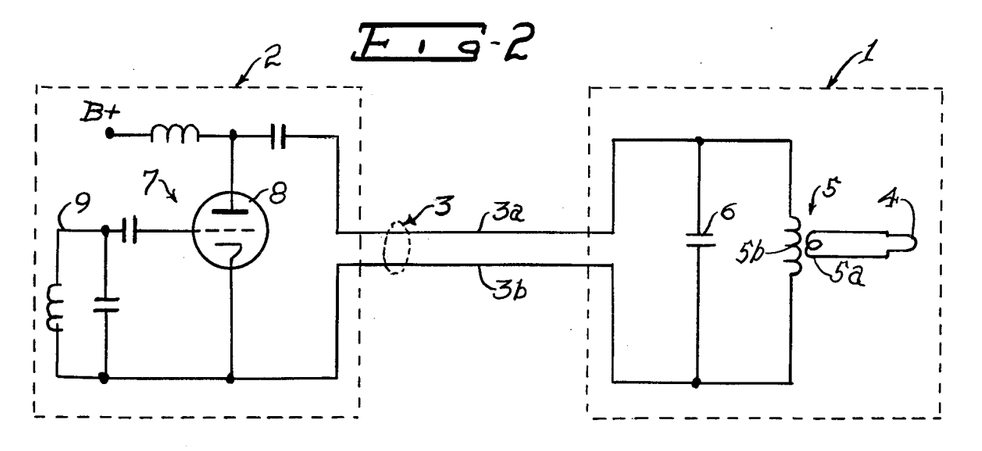
FIG. 2 is a simplified electrical schematic diagram of the induction heating apparatus of FIG. 1.

Shown in FIG. 2 is a schematic diagram illustrating separation of the power supply 2 and tank circuit and heater coil 1. The tank and heater coil unit 1 includes a single loop heater element 4 connected to a single turn secondary winding 5a of a current transformer 5. The primary winding 5b is connected in parallel with a capacitor 6 and forms the tuned circuit for the induction heating unit. Power is delivered to the parallel tuned circuit over a pair of lines 3a and 3b of the cable 3. The power supply 2 includes an oscillator circuit of the tuned-plate and tuned-grid type. The tuned circuit for the plate of the oscillator 7 is the tuned circuit formed by the primary winding 5b and capacitor 6. The oscillator tube 8 has a tuned circuit 9 connected to the grid electrode thereof and necessary feedback for oscillation is obtained through interelectrode capacitance between the grid and plate of the tube 8.

Figure 3:
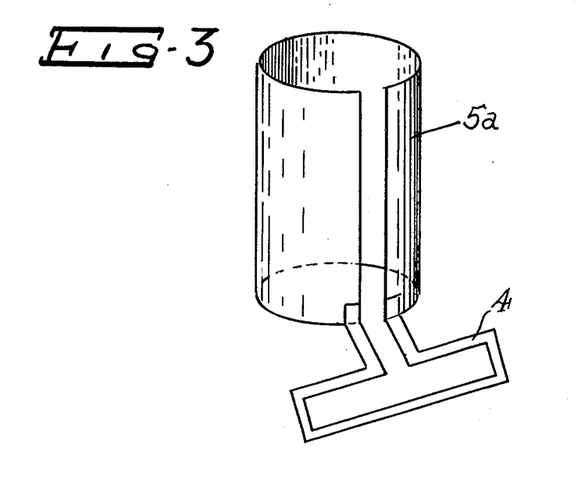
FIG. 3 is a simplified mechanical schematic illustration of the secondary winding and heating coil of the induction heating unit of this invention.

To combine the tank circuit and heater coil in a single unit the secondary winding 5a is formed of a single sheet of conductive material wrapped about the primary winding 5b and the heater element 4 is connected to the spaced apart edge portions of the sheet, this being best illustrated in FIG. 3. It will be understood that the single turn secondary winding can be located inwardly of the primary winding. Also, the connection of the heater coil 4 to the winding 5a can be made at either end or at an intermediate location.

Figures 4, 5:
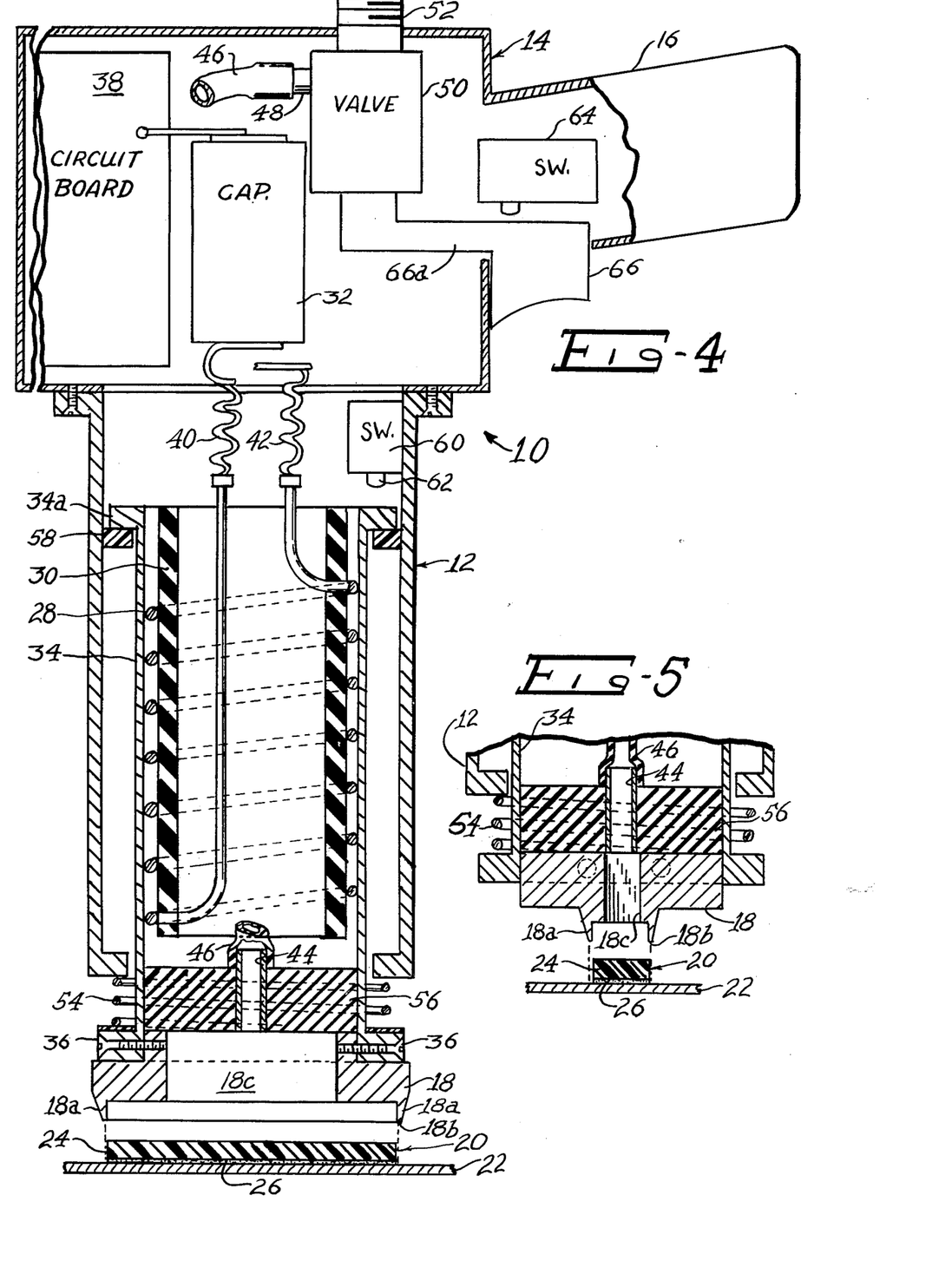
FIG. 4 is an elevated cross sectional view of a hand-held induction heating unit constructed in accordance with this invention and shows the details of the heater coil and a nose-piece which forms the tuned circuit components.
FIG. 5 is a fragmentary cross sectional view of a nosepiece shown in FIG. 4 but taken at 90° therefrom.

Referring to FIG. 4 there is seen the details of an induction heating unit utilizing the principles of this invention and designated generally by reference numeral 10. The induction heating unit includes a body portion 12 which is preferably of cylindrical configuration. A component receiving housing 14 is secured to one end of the body portion 12 for containing all of the components necessary for operation of the induction heating unit. At the other end of the body portion 12 is located a nosepiece heating element 18 which is designed to be of any suitable peripheral configuration to receive a correspondingly shaped clip 20 which is to be fastened, by thermosetting adhesives, to the surface of a sheet metal member 22.

In accordance with this invention the induction heating unit 10 will apply heat energy to the sheet metal 22 in a short period of time, in the order of two to four seconds, so that the sheet metal itself will then transfer heat to the clip 20. The clip 20 is shown only generally and has a main body portion 24 which may include resilient clip means, the details of which are not shown and which form the subject matter of a different patent application owned by the assignee of record. The body portion 24 of the clip 20 has thermosetting adhesive 26 formed on one side thereof and is thermally activated upon applying a temperature in the order of 200° to 400° for about two to three seconds. The sheet metal 22 rapidly dissipates the heat energy and quickly cools the thermosetting adhesive to set the same, this being in the order of one to three seconds. Since time for setting the thermosetting adhesive is relatively short, the induction heating unit 10 can be used for rapidly applying molding clips or the like to the vertical sides of automobiles without fear that the clip will fall off while the thermosetting adhesive is curing.

Within the body portion 12 is located a helical coil 28 which forms both the primary winding of a current transformer and the inductance element of a tuned circuit. The helical coil 28 is wound about a high dielectric support cylinder 30, or may be deposited thereon in a manner to be described. The helical coil 28 is here shown as being formed of a relatively heavy gauge copper wire or tubing having suitable insulation thereon, such as teflon or a varnish coating, so as to be electrically insulated from a metal sheet of material 34 which forms a single turn secondary winding of the current transformer. The single turn secondary winding receives RF energy from the primary winding 28 for applying induction heating currents to the heating coil nosepiece 18 which is secured thereto by screws 36. The secondary winding 34 has the form of a slotted cylinder with confronting edge portions along the slot so that it forms substantially an open circuit about the circumference thereof. The confronting edge portions of the slot are connected to corresponding spaced apart electrical connections of the nosepiece 18 so that circulating energizing currents will have a closed loop path to travel, this being shown more clearly in connection with FIGS. 12 and 15.

The helical coil 28 is connected in circuit with a capacitor 32 which may form either a series or prallel resonance network with the coil. The RF energy supplied to the capacitor and inductor is preferably square wave pulses of a frequency corresponding to the resonant frequency of the tuned circuit, this being about one megahertz. In accordance with this invention the circuit arrangement required for operation of the induction heating unit 10 is located in the component housing 14, preferably being mounted on a circuit board 38. Therefore, the only power cables that need be connected to the induction heating unit 10 is either a 115 volt two-line power cable or a DC power cable applying energizing current to the circuit board 38. A suitable power and timing circuit may be included on the circuit board 38 or may be a separate unit remote from the heating unit 10 but supplying only direct current voltage thereto and not RF energy which would otherwise cause high energy losses over the transmission lines. Since the circuit board 38 and capacitor 32 are connected close together, within the same component housing 14, and since the helical coil 28 is connected to the capacitor and circuit board through a pair of relatively short flexible leads 40 and 42, there is substantially no RF energy losses in the unit and great efficiency is thus achieved.

In the preferred embodiment of this invention the nosepiece 18 is formed to have peripheral wall portions thereof 18a having a relatively thin terminating edge 18b so that maximum transfer of RF energy is achieved into the metal plate 22. The peripheral configuration of the nosepiece 18 can take any form to snugly fit about the clip 20. The nosepiece preferably is made quickly interchangeable with the induction heating unit so that different configuration clips can be used by changing the nosepiece. The nosepiece 18 preferably has a hollow center portion 18c which is in fluid communication with a conduit 44 which, in turn, has connected thereto a flexible hose 46. Only a fragmentary portion of the flexible hose 46 is shown connected to the conduit 44, the other portion being eliminated for purposes of clarity. The other end of the flexible hose 46 is connected to an outlet 48 of a valve 50 which is located in the component housing 14. The valve 50 has a threaded coupling 52 which is connected to either an air or vacuum line, depending on the configuration of the valve. If an air line is used the valve will have a bypass outlet which causes air pressure passing over an orifice within the valve to create a vacuum within the hose 46 to hold the clip 20 in the nosepiece 18 until it is fastened to the metal sheet 22. Upon heating of the thermosetting adhesive 26 the valve will then cause a positive pressure to be supplied through the hose 46 and facilitate in removing or parting the nosepiece 18 from the clip 20. On the other hand, the valve 50 may be a two way valve with a positive pressure inlet and a negative pressure inlet so that vacuum and pressure can be utilized to hold the clip in place prior to applying it and then ejecting the clip immediately after applying it to the sheet metal surface 22.

The slotted cylinder forming the single loop secondary winding 34 is resiliently movably secured within the body 12 so that the nosepiece 18 can be maintained in flat pressure contact with the sheet metal 22 during energization of the induction heating unit. Upon pressing the nosepiece 18 against the surface of the sheet metal 22 the secondary winding 34, primary winding 28 and all associated components therewith move upwardly into the body 12 against the force of a coil spring 54 located at the lower end of the body 12 exteriorly of the secondary winding 34. An insulating block 56 is secured to the lower end of the secondary winding 34 and provides means for connecting the conduit 44 and flexible hose 46, while also providing structural support means for the nosepiece and slotted cylinder.

Figure 6:
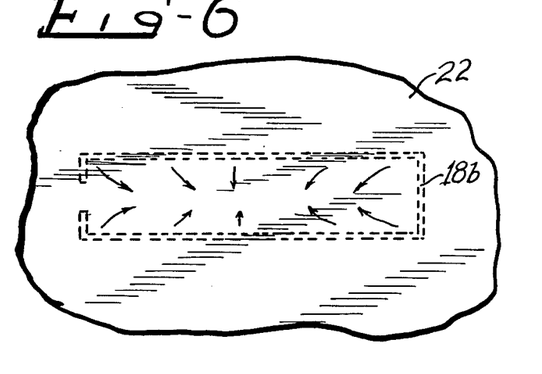
FIG. 6 is a fragmentary plan view of a rear portion of a sheet metal surface to be heated about the periphery of the nosepiece to thermally activate the adhesive on the back of a clip to be applied thereto.

FIG. 5 illustrates a sectional view taken 90° from that shown in FIG. 4 and further depicts the rectangular configuration of the peripheral walls 18a of the nosepiece while also showing the minimum transverse extent 18b which engages the surface of the plate 22. This is best illustrated in FIG. 6 which shows the plate 22 from the backside thereof and the dotted lines indicating the minimum wall thickness 18b formed by the periphery of the nosepiece 18. The curved arrowed lines directed inwardly are intended to indicate the direction of heat flow within the sheet metal during the induction process. However, because of the relatively large area around the heated area, the heat flows will reverse and quickly dissipate to cool and set the thermosetting adhesive.

Referring again to FIG. 4, the single turn secondary 34 has a radially outwardly extended flange 34a located at the top end thereof which engages a ring 58 secured within the body 12. The ring 58 provides a stop for the entire inductance assembly which is being urged outwardly by the bias spring 54. Also located within the body 12 is a switch 60 which has an actuating element 62 depending therefrom and engageable with the flange 34a. The switch 60 is connected in circuit with a second switch 64, which is the trigger switch of the unit and together therewith cause energization of the inductance heating unit 10 only when both switches are closed. For example, switch 60 is electrically connected in series with the switch 64 and will cause actuation of the induction heating unit only when the nosepiece 18 is pressed firmly against the sheet 22 to depress the entire inductance assembly to actuate the switch. Once the switch 60 is actuated then the trigger switch 64 can be actuated by depressing the trigger 66 manually. The trigger 66 has an extended portion 66a which is connected to the valve 50 for simultaneous operation thereof. For example, when the clip 20 is placed within the nosepiece it will be held there by a vacuum line and upon actuation of the switch 60 and the subsequent release thereof the clip will be ejected by a positive pressure and left on the surface of the sheet metal 22.

Figure 7:
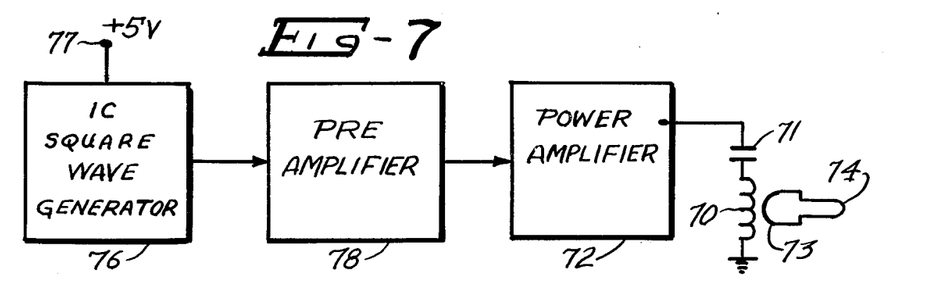
FIG. 7 is a simplified block diagram of the control circuit utilized in the induction heating unit of this invention.
Figure 8:
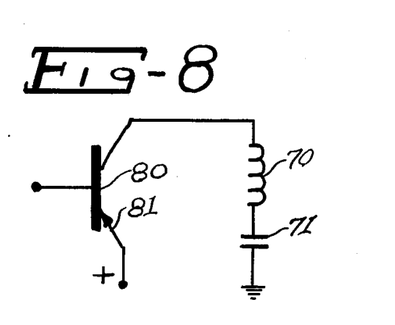
FIG. 8 illustrates the component connection of the output circuit of a power amplifier for energizing an inductance and capacitance network which make up the induction heating unit of this invention.

Referring now to FIG. 7 there is seen a simplified block diagram of a circuit arrangement which can be mounted within the component housing 14 of FIG. 4. Here a primary winding 70, which may correspond to the winding 28 of FIG. 4, is connected in series with a capacitor 71, which may correspond to the capacitor 32 of FIG. 4, to form a tuned circuit for receiving square wave pulses from a power amplifier circuit 72. The winding 70 also forms a primary of a current transformer which has a single turn secondary winding 73 positioned in close proximity thereof. The single turn secondary corresponds to the slotted cylinder 34 of FIG. 4. The secondary winding 73 is coupled to a looped heating element 74, which corresponds to the heating element nosepiece 18 and which applies inductive heating energy to the surface of the metal plate 22. The circuit of FIG. 7 includes an IC square wave generator 76 which receives operating potential from a terminal 77, or other suitable means, and which provides RF signals to a preamplifier 78. The components comprising the IC square wave generator, preamplifier 78 and power amplifier 76 are of conventional construction and readily available. For example, the IC square wave generator is formed of an integrated circuit supplied by Motorola Corporation under Part No. MC1648. The preamplifier and power amplifier may be conventional transistor components. For example, FIG. 8 shows a power amplifier transistor 80 having an emitter electrode 81 connected to a positive potential to supply RF pulsating power to an associated tuned circuit. In this instance, the tuned circuit has the inductance 70 and capacitor 71 reversed to illustrate an alternate form of the invention. When this is the case the capacitance 71 may be formed by the inner electrode capacitance or added capacitance associated with the single turn secondary winding.

Figure 9:
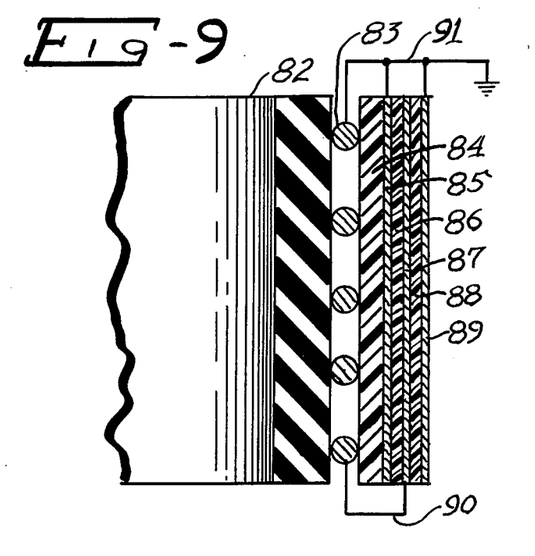
FIG. 9 is a fragmentary partial sectional view of inductance and capacitance elements formed about the cylindrical support and which can be used in the induction heating gun of FIG. 4.
Figure 10:
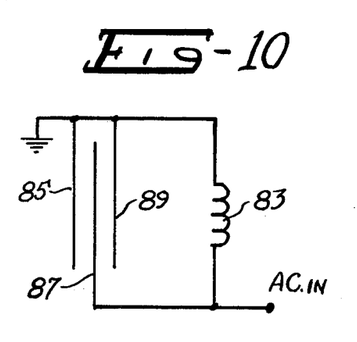
FIG. 10 is a simplified circuit diagram showing the equivalent circuit of the components shown in FIG. 9.
Figure 15:
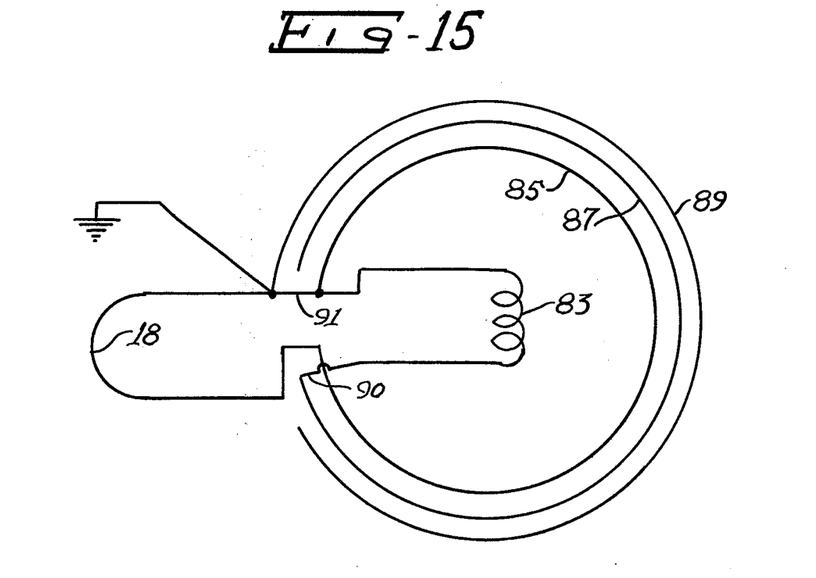
FIG. 15 is a top somewhat diagrammatic view of the unit of FIG. 9 and shows the primary and heating coil connections to the various plates forming the capacitance and secondary winding of the induction unit.

For example, a capacitor can be formed by a plurality of metal plates formed of slotted cylinders similar to the single turn secondary winding 34 of FIG. 4. This is illustrated in FIG. 9 which has an insulating support cylinder 82 for receiving a helical coil structure indicated by reference numeral 83. Positioned outwardly of the helical coil 83 is an insulating sleeve 84 upon which is positioned a conductive layer or sheet 85 to form a slotted cylinder. A second insulating layer 86 is applied over the sheet 85 and a second conductive layer 87 is applied over the insulating layer 86 to form a second slotted cylinder. A third insulating layer 88 and a third conductive layer 89 are formed at the outermost portion of the cylinder structure in like manner and the slots of each of the slotted cylinders are arranged to be in alignment one over the other as shown in FIG. 15. The center conductive layer 87 is electrically connected to the bottom portion of the helical coil by means of a line 90 while the inner and outer conductive layers 85 and 89 respectively are connected together and to the top portion of the coil 83 by a conductor 91. The cross sectional structure shown in FIG. 9 is only a fragmentary portion of a cylindrical structure through which one wall portion is sectioned. The equivalent electrical circuit of the structure shown in FIG. 9 is illustrated in FIG. 10 and a diagrammatic circuit is shown in FIG. 15. The structure of FIG. 9 can be used in the unit shown in FIG. 4 to replace the helical coil 28 and slotted cylinder 34. While the nosepiece 18 connection is not shown in FIGS. 9 and 10, it is shown in FIG. 15 as being the connection between the tied together ends of the outer plates 85 and 89 at one end and to the innermost plate 85 at the other end. Other connection arrangements can be incorporated, if desired.

Figure 11:
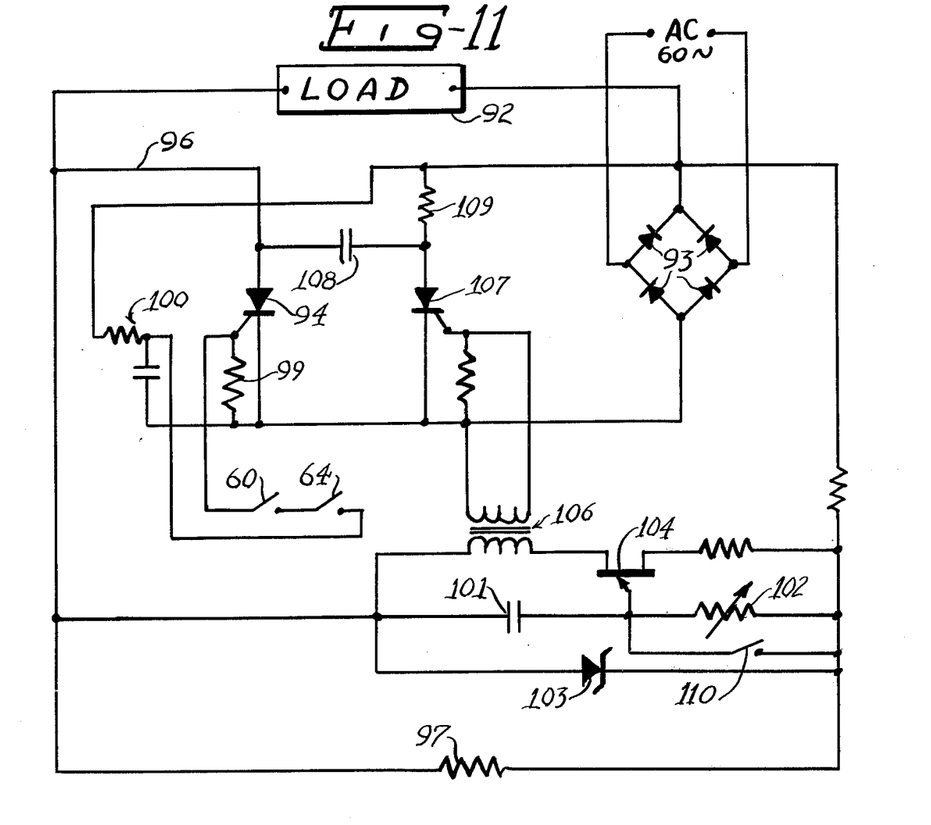
FIG. 11 is a schematic diagram of the power supply and timing control circuit utilized to precisely control the RF energization of the inductance unit of this invention.

FIG. 11 shows a control circuit used to precisely control the time interval during which the circuit of FIG. 7 is energized. The controlled power supply of FIG. 11 may have several different voltage value outputs or a single voltage value output and may be connected to one or more of the circuit components of FIG. 7. The entire circuit arrangement of FIG. 7 is illustrated by a load 92 which has one terminal thereof connected to the output of a bridge rectifier circuit 93 and the other terminal thereof connected to the anode of a silicon controlled rectifier 94 via a line 96. The line 96 is also connected to a resistor 97 and a timing network 98 which controls the time duration during which the power supply is operative. Silicon controlled rectifier 94 is maintained in a nonconductive state when the power supply is turned off or disabled.

The silicon controlled rectifier 94 includes a voltage developing resistor 99 connected across the gate cathode juncture thereof and a resistance capacitance network 100 to provide a trigger pulse when both switches 60 and 64 are closed. Switches 60 and 64 of FIG. 11 correspond to switches 60 and 64 of FIG. 4 and operate to provide a safety function for the induction heating unit as described above. When both switches are closed silicon controlled rectifier 94 is rendered conductive to connect line 96 therethrough to the other side of the bridge rectifier 93 and complete circuit through the load 92. Also at this time the high voltage on line 96 is reduced to zero or a negative voltage which, in turn, causes the timing circuit 98 to provide a charge path through a timing capacitor 101 connected in series with a variable resistor 102. The timing circuit is voltage regulated by a zener diode 103 and upon reaching a predetermined charge value capacitor 101 renders unijunction transistor 104 conductive to deliver a pulse of current through the primary winding of a pulse transformer 106. The pulse transformer 106 will then render a second silicon controlled rectifier 107 conductive which, in turn, causes a commutating capacitor 108 to apply a negative voltage to the anode of silicon controlled rectifier 94 and turn it off to deenergize the circuit of FIG. 7. A resistor 109 is connected in series with the silicon controlled rectifier 107 to limit the current. Closure of switches 60 and 64 will initiate current being applied to the load 92 and the timing circuit 98, by means of the output pulse from the trigger transformer 106 and silicon controlled rectifier 107, will turn off the power supply to deenergize the load 92. Variable resistor 102 allows adjustment of the time interval during which power is applied to the load 92. This may vary from between a fractional part of a second to five or more seconds, it being understood that the time element will vary with the conditions under which the induction heating unit is used.

A safety switch 110 may be connected in parallel with the potentiometer 102 and is open when both switches 60 and 64 are closed and the induction heating element is in a normal operating condition. However, should the induction heating unit be removed prematurely from the surface of the metal plate 22, switch 110 will close to quickly charge capacitor 101 to render unijunction transistor 104 conductive to provide a gate pulse on silicon controlled rectifier 107. This will immediately commutate silicon controlled rectifier 94 off and deenergize the load 92.

Figure 12:
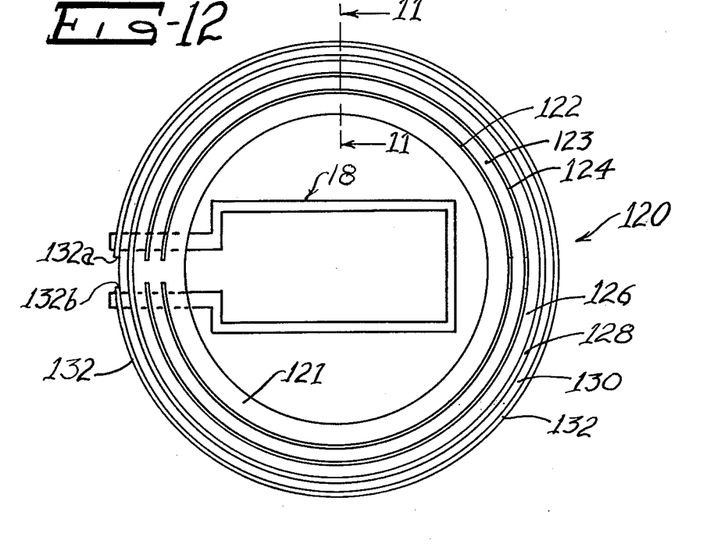
FIG. 12 is a top view showing an alternate construction of inductance and capacitance elements which can be utilized in the induction heating unit of FIG. 4.
Figure 13:
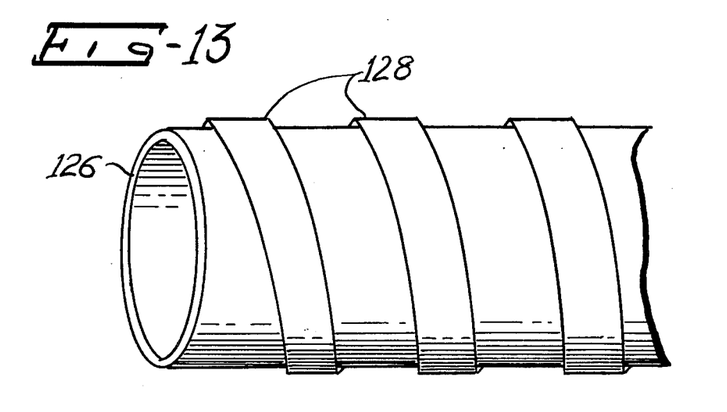
FIG. 13 is a perspective view showing the formation of deposited helical coils on an insulating support which is used in the construction of FIG. 12.
Figure 14:
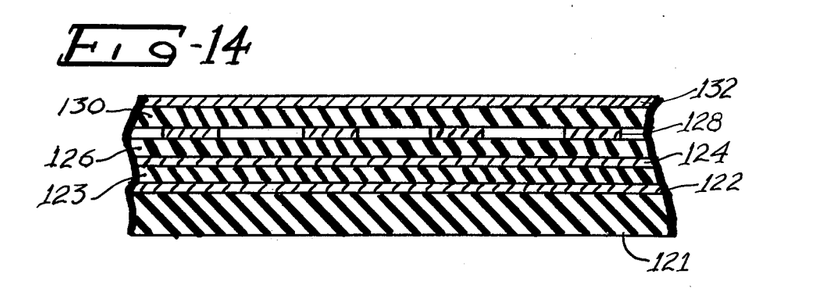
FIG. 14 is an enlarged cross sectional view taken along line 14—14 of FIG. 12.

Referring now to FIGS. 12, 13 and 14, a still further alternate form of this invention is illustrated. Here an induction heating coil arrangement 120 is shown and which is designed to fit within the induction heating unit 10 of FIG. 4. The induction heating coil arrangement comprises a plurality of layers of conductive sheet material either formed on insulating cylinders or deposited thereon, and the helical coil is formed by a deposited conductor about one-half inch wide and between 0.010 and 0.030 inches thick. The entire structure is compact and provides both the inductance and capacitance necessary for the tuned circuit while also forming the current transformer primary and secondary windings. For example, the inductance heating element 120 includes a cylindrical insulating support cylinder 121 upon which is placed a conductive layer 122. A second insulating layer 123 is formed over the conductive layer 122 and provides the dielectric component for a capacitor formed between the plate 122 and a second conductive layer 124. A second layer of insulating material 126 is formed over the conductive layer 124 and provides a support surface upon which is deposited a helical coil element 128. This is best seen in FIG. 13 which shows the helical coil 128 as being formed of a rectangular conductive element helically formed about the insulating layer 126. As mentioned above, the width of the conductive elements forming the coil 128 may be in the order of about one-half inch wide and between 0.010 and 0.030 inches thick, more or less. The flat ribbon-like helical coil 128 forms the primary winding of the current transformer and the inductance element of the tuned circuit, the capacitance element thus being formed by the plates 122 and 124. A final insulating layer 130 is formed over the ribbon-like helical coil 128 and a single turn secondary winding 132, which is a slotted cylinder as mentioned above, is formed over the entire assembly. In FIG. 12 the slotted cylinder 132 is best illustrated as shows confronting edge portions 132a and 132b in close proximity to one another and which provide terminating ends to which are connected the open end portions of the nosepiece 18. The nosepiece 18 is turned inwardly to save space and provide a more compact induction heating unit.

While several distinct embodiments of the induction heating unit of this invention have been illustrated, it will be understood that other variations and modifications of this invention may be effected without departing from the spirit and scope of the novel concepts disclosed and claimed herein.

The invention is claimed as follows:

1. In an induction heating unit the structural interrelation of a tank circuit of a power supply and a current transformer formed about a generally cylindrical tubular support providing a compact unit, the unit including a first, multiturn coil means wrapped about the support and forming both the inductance element of the tuned tank circuit and the primary winding of a current transformer, laminated tubular capacitance means formed about the support and providing the capacitance of the tuned tank circuit, second coil means formed about the support and providing the secondary coil of the current transformer, inductive heating means connected to the second coil means for developing induction heating currents in an article to be heated, wherein the coil means and capacitance means are all cooperatively laminated over the support structure, the capacitance means being formed about the support structure with a pair of conductive sheet material layers having a layer of dielectric material formed therebetween, a layer of electrical insulating material formed over the layers of conductive sheet material, a ribbon-like first coil means deposited over the layer of electrical insulating material, a further layer of electrical insulating material formed over the first coil and a single turn of metal sheet material forming a second coil means formed over said further layer of insulating material.

2. The induction heating unit in accordance with claim 1, wherein said second coil means is incorporated in and forms a pair of plates of said tubular capacitance means.

3. The induction heating unit of claim 2 wherein said second coil means is formed of two single turns of metal sheet material forming inner and outer spaced apart sheets wrapped about said first coil means and terminating along a longitudinal axis with confronting edge portions of each sheet spaced from one another, said inner and outer sheets being electrically connected together along first common radially spaced apart edge portions and electrically disconnected along second common radially spaced apart edge portions, said heater means including an inductance element having one end thereof connected to said first common radially spaced apart edge portion and the other end thereof connected only to the inner sheet of said second common radially spaced apart edge portion.

4. The induction heating unit of claim 3 further including a third metal sheet interposed between said inner and outer sheets, said third sheet being directly connected to said first coil means at one end thereof and together with said inner and outer sheets forming a secondary winding for said first coil means and a capacitance element with said inner and outer sheets.

5. The induction heating unit of claim 1 wherein said heating means includes a nosepiece having a thin wall periphery substantially surrounding the article to be heated, said nosepiece being electrically connected to said second coil means by closely spaced apart terminal ends.

6. The induction heating unit of claim 1 wherein said first coil means is a helical coil and said second coil means is a single turn of metal sheet material wrapped about said helical coil.

7. The induction heating unit of claim 1 wherein said single turn of metal sheet material is a split cylinder having spaced apart confronting edges to form terminal connections, and said induction heating means being connected to said terminal connections.

8. The induction heating unit of claim 7 wherein said single turn of metal sheet material has a longitudinal extent greater than said given longitudinal dimension of said helical coil.

* * * * *